United States Patent
Lee et al.

(10) Patent No.: US 11,450,670 B1
(45) Date of Patent: Sep. 20, 2022

(54) SEMICONDUCTOR MEMORY CELL AND THE FORMING METHOD THEREOF

(71) Applicant: UNITED MICROELECTRONICS CORP., Hsin-Chu (TW)

(72) Inventors: Kuo-Hsing Lee, Hsinchu County (TW); Kun-Hsien Lee, Tainan (TW); Sheng-Yuan Hsueh, Tainan (TW); Chang-Chien Wong, Tainan (TW); Ching-Hsiang Tseng, Tainan (TW); Tsung-Hsun Wu, Kaohsiung (TW); Chi-Horn Pai, Tainan (TW); Shih-Chieh Hsu, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/230,975

(22) Filed: Apr. 14, 2021

(30) Foreign Application Priority Data

Mar. 22, 2021  (CN) .......................... 202110301918.X

(51) Int. Cl.
   *H01L 27/108* (2006.01)
(52) U.S. Cl.
   CPC .... *H01L 27/10805* (2013.01); *H01L 27/1085* (2013.01)

(58) Field of Classification Search
   None
   See application file for complete search history.

(56) References Cited

U.S. PATENT DOCUMENTS

| | | | |
|---|---|---|---|
| 2005/0045888 A1* | 3/2005 | Kadowaki | H01L 27/0629 257/E21.345 |
| 2012/0195091 A1 | 8/2012 | Schmitt | |
| 2014/0098591 A1 | 4/2014 | Chen | |
| 2017/0069766 A1* | 3/2017 | Park | H01L 29/94 |

* cited by examiner

*Primary Examiner* — Anthony Ho
*Assistant Examiner* — Kevin Quinto
(74) *Attorney, Agent, or Firm* — Winston Hsu

(57) ABSTRACT

The invention provides a semiconductor memory cell, the semiconductor memory cell includes a substrate having a first conductivity type, a doped region in the substrate, wherein the doped region has a second conductivity type, and the first conductivity type is complementary to the second conductivity type, a capacitor insulating layer and an upper electrode on the doped region, a transistor on the substrate, and a shallow trench isolation disposed between the transistor and the capacitor insulating layer, and the shallow trench isolation is disposed in the doped region.

18 Claims, 2 Drawing Sheets

SEMICONDUCTOR MEMORY CELL AND THE FORMING METHOD THEREOF

BACKGROUND OF THE INVENTION

1. Field of the Invention

The present invention relates to the field of semiconductors, in particular to a semiconductor memory cell including doped region resistors and a manufacturing method thereof.

2. Description of the Prior Art

Semiconductor memory devices, such as non-volatile memory (NVM), have been widely used in various electronic devices, such as mobile phones, digital cameras, personal digital assistants, mobile computing devices and other applications.

Generally, NVM can be divided into multiple programmable (MTP) memory and one-time programmable (OTP) memory. The MTP memory can read and write many times. For example, EEPROM and flash memory are designed with corresponding circuits to support different operations such as programming, erasing or reading. OTP memory has programming and reading functions, and does not need a circuit for erasing operation.

Compared with fuse, anti-fuse is a kind of device whose two ends are short-circuited after fusing. Generally, the two ends of the anti-fuse are separated by an insulating layer such as silicon oxide. In the off state, there is a high resistance value between the two ends of the anti-fuse. By applying a high voltage to break through the insulating layer, the two ends of the anti-fuse form a short circuit with a low resistance value of about 5-25 kOhms. Therefore, the anti-fuse is suitable for use in a programmed memory. Because of the one-time programming (OTP) characteristics, the programmed memory using anti-fuse can provide better protection in security.

SUMMARY OF THE INVENTION

The invention provides a semiconductor memory cell, which comprises a substrate including a first conductivity type, a doped region in the substrate, wherein the doped region has a second conductivity type and the first conductivity type is complementary to the second conductivity type, a capacitor insulating layer and an upper electrode on the doped region, a transistor on the substrate, and a shallow trench isolation between the transistor and the capacitor insulating layer The invention also provides a method for forming a semiconductor memory cell, which comprises providing a substrate containing a first conductivity type, forming a doped region in the substrate, wherein the doped region has a second conductivity type and the first conductivity type is complementary to the second conductivity type, forming a capacitor insulating layer and an upper electrode on the doped region, forming a transistor on the substrate, and forming a shallow trench isolation between the transistor and the capacitor The invention provides an improved semiconductor memory device, which is characterized in that the semiconductor memory device not only comprises a transistor and a capacitor, but also comprises a resistor composed of a doped region arranged between the capacitor and the transistor. The resistor can effectively reduce the voltage difference between the capacitor and the transistor, and prevent excessive current from flowing into transistor and causing transistor damage. In addition, the size of the capacitor Can be adjusted more flexibly. The method has the advantages of improving the flexibility of the manufacturing process and improving the quality of the semiconductor memory device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the FIG.s are only for illustration and the FIG.s may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
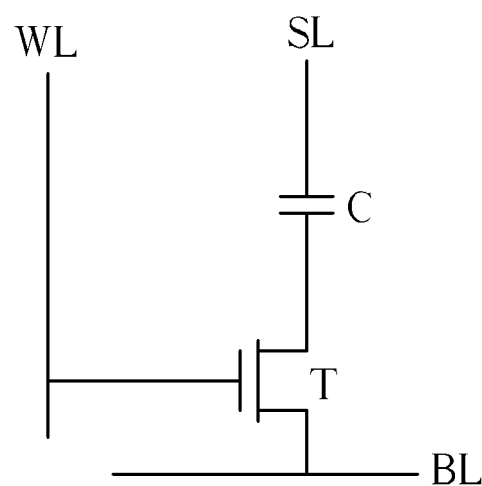
FIG. 1 shows a circuit diagram of a semiconductor memory cell.
Figure 2:
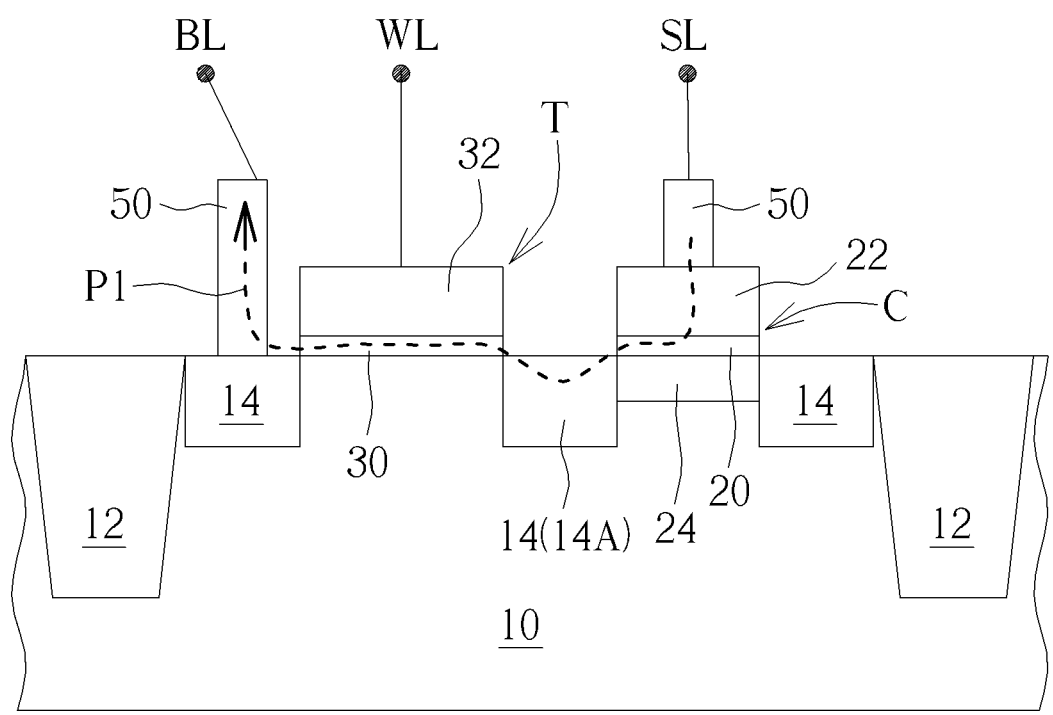
FIG. 2 shows a schematic cross-sectional structure of a semiconductor memory cell corresponding to FIG. 1 according to the present invention.

Please refer to FIG. 1 and FIG. 2. FIG. 1 shows a circuit diagram of a semiconductor memory cell, and FIG. 2 shows a schematic cross-sectional structure of a semiconductor memory cell corresponding to FIG. 1 according to the present invention. As shown in FIG. 1, a semiconductor memory cell 1 is provided. The gate of a transistor T is connected to a word line WL, one end of the transistor's source/drain is connected to a capacitor C, another end of the transistor's source/drain is connected to a bit line BL, and the end of the capacitor C is connected to a selection line SL. That is, the semiconductor memory cell 1 is mainly composed of a transistor T and a capacitor C, so it can also be called one transistor and one capacitor (1T1C) memory cell. In addition, the semiconductor memory cell 1 is controlled by a word line WL, a bit line BL and a select line SL.

Referring to FIG. 2, a semiconductor memory cell 1 includes a substrate 10, such as a P-Sub, which includes a plurality of shallow trench isolations (STI) 12 and a part of doped regions 14, wherein the shallow trench isolations 12 contain insulating materials, and the doped regions 14 are doped with ions so as to conduct electricity, and part of the doped regions 14 (or doped regions 14A) can be used as sources/drains of transistors T. In this embodiment, the doped region 14 is, for example, a high-concentration N-type doped region. That is, the doped region 14 and the substrate 10 contain different conductivity types. The semiconductor memory cell 1 also includes a capacitor C, wherein the capacitor C includes a capacitor insulating layer 20 on the substrate, an upper electrode 22, and a high-concentration doped region 24 in the substrate 10. The capacitor insulating layer 20 comprises an insulating material, such as silicon oxide, the upper electrode 22 comprises a conductive material, such as metal or polysilicon, and the high-concentration doped region 24 is located in the substrate 10 and has conductive characteristics, which can be used as the lower electrode of the capacitor C, such as a high-concentration N-type doped region.

The semiconductor memory cell 1 further comprises a transistor T, wherein the transistor T comprises a transistor insulating layer 30 and a gate 32 formed on the substrate 10, and the gate 32, the transistor insulating layer 30 and the doped region 14 (serving as a source/drain) partially located in the substrate 10 together constitute the transistor T.

In addition, the transistor T and the capacitor C can be connected to the word line WL and the selection line SL respectively, and one source/drain (the doped region 14) of the transistor is connected to the bit line BL.

In addition, the semiconductor memory unit 1 can optionally include a plurality of contact structures 50 for connecting various elements. For example, the transistor T, the capacitor C, the doped region 14, the word line WL, the bit line BL, the selection line SL and so on are connected. The contact structure 50 comprises a conductive material, such as, but not limited to, metal.

When operating the semiconductor memory cell, there is an insulating layer between the upper and lower electrodes of the capacitor C at first, so the semiconductor memory cell is set to a high resistance state (H). When programming, the gate of the transistor T will be controlled by the word line WL, and a voltage will be introduced from the outside (for example, through the selection line SL). When the voltage is high enough and passes through the capacitor C, the capacitor C will breakdown, and then the capacitor C will conduct current. For example, according to the applicant's experimental results, under a fixed voltage, the measured current of the semiconductor memory cell is more than 10 μA (microamperes), which is regarded as low resistance state (L), while the measured current is less than 10 nA (nano-amps), which is regarded as high resistance state (H). In addition, it should be noted that a complete memory can include an array composed of a plurality of the above-mentioned semiconductor memory cells 1, and the purpose of storing data can be achieved by programming the selected semiconductor memory cells.

The applicant found that the semiconductor memory cell 1 shown in FIG. 2 has a disadvantage, that is, when a high voltage is introduced to the capacitor C from outside, the current path will pass through the capacitor C and the transistor T in sequence (such as the current path P1 shown in FIG. 2). When the current passes through the transistor T, it is easy to generate a large voltage difference and a large current between the source/drain (the doped region 14A) of the transistor T and the transistor insulation layer 30. This may damage the transistor T (for example, the transistor T also collapses) and affect the accuracy of the semiconductor memory cell.

Figure 3:
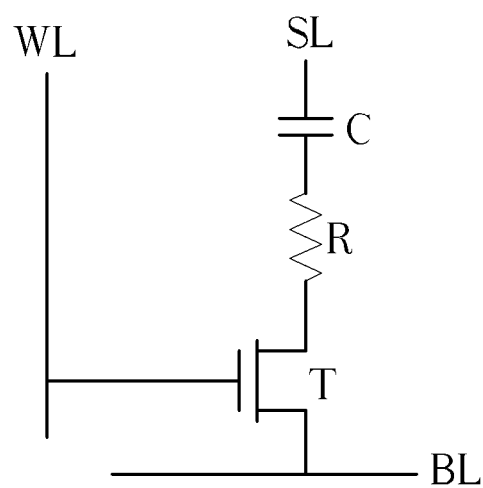
FIG. 3 shows a circuit diagram of a semiconductor memory cell according to a preferred embodiment of the present invention.
Figure 4:
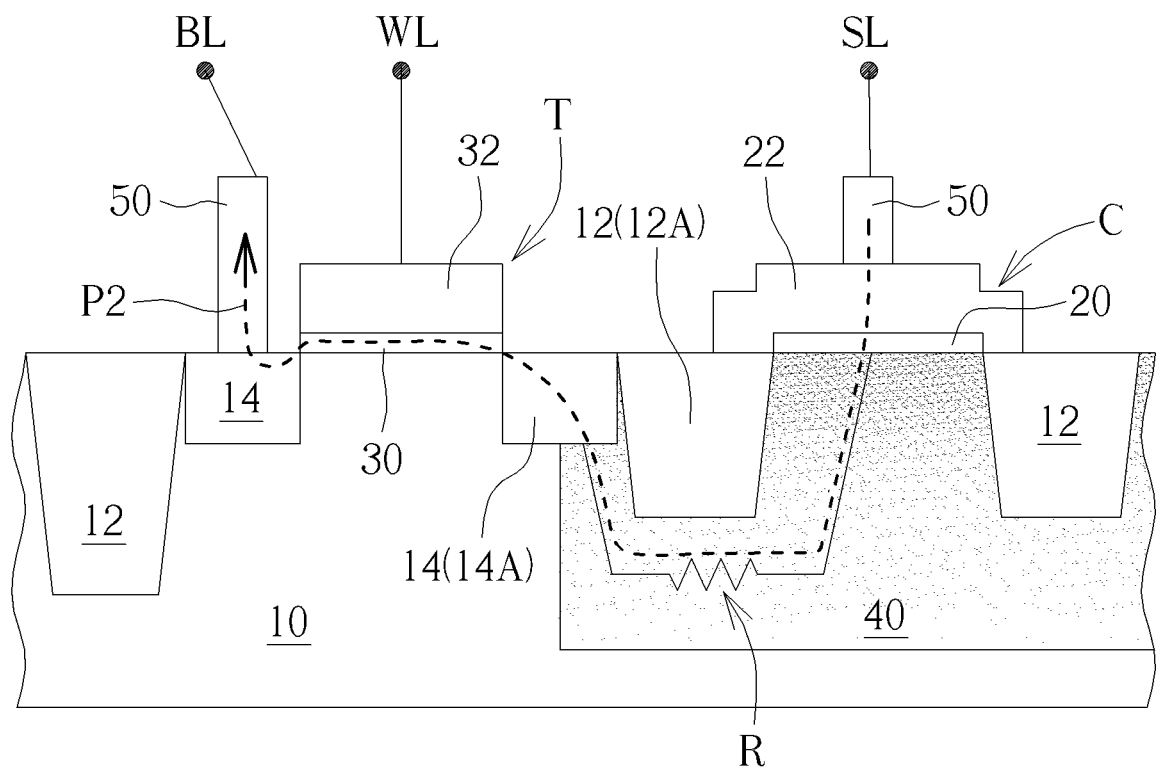
FIG. 4 is a cross-sectional structure diagram of a semiconductor memory cell corresponding to FIG. 3 according to the present invention.

Therefore, in order to avoid the above problems, the present invention proposes an improved semiconductor memory cell. Please refer to FIG. 3 and FIG. 4. FIG. 3 shows a circuit diagram of a semiconductor memory cell according to a preferred embodiment of the present invention, and FIG. 4 shows a schematic cross-sectional structure diagram of a semiconductor memory cell corresponding to FIG. 3 of the present invention. In order to clearly express the differences between different embodiments, the following paragraphs will describe the differences among different embodiments, and other identical elements will be denoted by the same reference numerals, and these identical elements have the same characteristics, such as the same materials or the same manufacturing process, so they will not be described in detail.

As shown in FIG. 3, the semiconductor memory cell 2 proposed in this embodiment includes a resistor R in addition to the transistor T and capacitor C mentioned above. Therefore, from the circuit diagram, the semiconductor memory cell 2 is mainly composed of a transistor T, a capacitor C and a resistor R, so it can also be called a memory cell with one transistor, one capacitor and one resistor (1T1C1R).

As shown in FIG. 4, this embodiment is different from the above embodiment shown in FIG. 2 in that the lower electrode (i.e., the high-concentration doped region 24) included in the capacitor C is replaced by a doped region 40 with a larger range and a deeper depth, wherein the doped region 40 also has a conductivity type opposite to that of the substrate 10 (e.g., N-type). In addition, at least one shallow trench isolation (such as the shallow trench isolation 12A shown in FIG. 4) is located in the doped region 40 and between the transistor T and the capacitor C. In which the depth of the doped region 40 will be greater than that of the shallow trench isolation 12A. In addition, it should be noted that the doping concentration of the doped region 40 may show a gradient decreasing, for example, gradually decreasing from top to bottom. In addition, in this embodiment, the width of the upper electrode 22 of the capacitor C may be larger than that of the capacitor insulating layer 20, and part of the upper electrode 22 covers the shallow trench isolation 12 or the shallow trench isolation 12A.

The feature of this embodiment is that the bottom electrode of the capacitor C is replaced by a doped region 40, the depth of which is greater than that of the shallow trench isolation 12A, and the doping concentration of the doped region 40 gradually decreases from top to bottom, so the doped region 40 can be used as a resistor R to connect the capacitor C with the transistor T. Referring to the current path P2 marked in FIG. 4, when the current is introduced from the selection line SL, the current will pass through the capacitor C, bypass the lower part of the shallow trench isolation 12A (that is, through the resistor R) and the transistor T in sequence, and then flow out from the bit line BL at the drain end of the transistor T. The doping concentration of the doped region 40 decreases from top to bottom, so the resistance value in the doped region 40 increases from top to bottom, which can effectively reduce the current value when the current passes through the doped region 40. This embodiment has the following advantages: firstly, the existence of the resistor R can reduce the current between the capacitor C and the transistor T, prevent the transistor T from being affected by excessive current, and improve the quality of the semiconductor memory cell. Furthermore, the resistance value of the resistor R can be adjusted according to the doping concentration of the doped region 40 and the depth of the shallow trench isolation 12A, so that the manufacturing process is more flexible. In addition, since the area of the doped region 40 as the lower electrode of the capacitor C becomes larger, the size of the upper electrode 22 of the capacitor C can be enlarged as required without being limited by the size of the lower electrode.

According to the above figures and description paragraphs, the present invention provides a semiconductor memory cell 2, which comprises a substrate 10 including a first conductivity type (e.g., P-type), a doped region 40 located in the substrate 10, wherein the doped region 10 has a second conductivity type (e.g., N-type), the first conductivity type (P-type) is complementary to the second conductivity type (N-type), and a capacitor insulating layer 20 and an upper electrode 22 located on the doped region 40, a transistor T located on the substrate 10, and a shallow trench isolation 12A located between the transistor T and the capacitor insulating layer 20, and the shallow trench isolation 12A is located in the doped region 40.

According to another aspect of the present invention, there is provided a method for forming a semiconductor memory cell 2, which comprises providing a substrate 10 containing a first conductivity type (e.g., P-type) and forming a doped region 40 in the substrate 10, wherein the doped region 10 has a second conductivity type (e.g., N-type), and the first conductivity type (P-type) is complementary to the second conductivity type (N-type) On the doped region 40, a transistor T is formed on the substrate 10, and a shallow trench isolation 12A is formed between the transistor T and the capacitor insulating layer 20, and the shallow trench isolation 12A is in the doped region 40.

In some embodiments of the present invention, a depth of the doped region 40 is greater than a depth of the shallow trench isolation 12A.

In some embodiments of the present invention, the capacitor insulating layer 20, the upper electrode 22 and part of the doped region 40 together form a capacitor C.

In some embodiments of the present invention, a selection line SL is further included, which is electrically connected to the capacitor.

In some embodiments of the present invention, the doped region 40 has ions of the second conductivity type (e.g., N-type), and a doping concentration of the ions gradually decreases from top to bottom.

Some embodiments of the present invention further include a word line WL electrically connected to a gate of the transistor T, wherein the gate of the transistor is not located directly above the doped region 40.

In some embodiments of the present invention, a source of the transistor (the doped region 14A on the right side of the transistor T in FIG. 4) is located in the substrate 10, and the source has a second conductivity type (N-type).

In some embodiments of the present invention, one part of the source (the doped region 14A on the right side of the transistor T in FIG. 4) is located in the doped region 40, and the other part of the source is located in the substrate 10 with the first conductivity type (P-type).

In some embodiments of the present invention, the transistor T includes a drain (the doped region 14 on the left side of the transistor T in FIG. 4) located in the substrate 10, and further includes a bit line BL electrically connected to the drain.

In some embodiments of the present invention, a part of the upper electrode 22 covers right above the shallow trench isolation 12A, and a width of the capacitor insulating layer 20 is smaller than a width of the upper electrode 22.

To sum up, the present invention proposes an improved semiconductor memory device, which is characterized in that the semiconductor memory device not only comprises a transistor and a capacitor, but also comprises a resistor composed of a doped region arranged between the capacitor and the transistor. The resistor can effectively reduce the voltage difference between the capacitor and the transistor, and prevent excessive current from flowing into transistor and causing transistor damage. In addition, the size of the capacitor C can be adjusted more flexibly. The method has the advantages of improving the flexibility of the manufacturing process and improving the quality of the semiconductor memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory cell, comprising:
    a substrate including a first conductivity type;
    a doped region in the substrate, wherein the doped region has a second conductivity type, and the first conductivity type is complementary to the second conductivity type;
    a capacitor insulating layer and an upper electrode located on the doped region;
    a transistor on the substrate; and
    a shallow trench isolation located between the transistor and the capacitor insulating layer, and located in the doped region, wherein a part of the upper electrode directly covers above the shallow trench isolation, and a width of the capacitor insulating layer is smaller than a width of the upper electrode.

2. The semiconductor memory cell according to claim 1, wherein a depth of the doped region is greater than a depth of the shallow trench isolation.

3. The semiconductor memory cell according to claim 1, wherein the doped region has ions of the second conductivity type, and a doping concentration of the ions gradually decreases from top to bottom.

4. The semiconductor memory cell according to claim 1, further comprising a word line electrically connected to a gate of the transistor, wherein the gate of the transistor is not located directly above the doped region.

5. The semiconductor memory cell according to claim 1, wherein the capacitor insulating layer, the upper electrode and part of the doped region together form a capacitor.

6. The semiconductor memory cell according to claim 5, further comprising a selection line (SL) electrically connected to the capacitor.

7. The semiconductor memory cell according to claim 1, wherein a source of the transistor is located in the substrate, and the source has the second conductivity type.

8. The semiconductor memory cell according to claim 7, wherein a part of the source is located in the doped region, and another part of the source is located in the substrate with the first conductivity type.

9. The semiconductor memory cell according to claim 7, wherein the transistor comprises a drain in the substrate, and further comprises a bit line (BL) electrically connected to the drain.

10. A method for forming a semiconductor memory cell, comprising:
    providing a substrate including a first conductivity type;
    forming a doped region in the substrate, wherein the doped region has a second conductivity type, and the first conductivity type is complementary to the second conductivity type;
    forming a capacitor insulating layer and an upper electrode on the doped region;
    forming a transistor on the substrate; and forming a shallow trench isolation between the transistor and the capacitor insulating layer, and the shallow trench isolation is located in the doped region, wherein a part of the upper electrode directly covers above the shallow trench isolation, and a width of the capacitor insulating layer is smaller than a width of the upper electrode.

11. The method of claim 10, wherein a depth of the doped region is greater than a depth of the shallow trench isolation.

12. The method according to claim 10, wherein the doped region has ions of the second conductivity type, and a doping concentration of the ions gradually decreases from top to bottom.

13. The method of claim 10, further comprising forming a word line electrically connected to a gate of the transistor, wherein the gate of the transistor is not located directly above the doped region.

14. The method according to claim 10, wherein the capacitor insulating layer, the upper electrode and part of the doped region together form a capacitor.

15. The method according to claim 14, further comprising forming a selection line (SL) electrically connected to the capacitor.

16. The method as claimed in claim 10, wherein a source of the transistor is located in the substrate, and the source has the second conductivity type.

17. The method according to claim 16, wherein a part of the source is located in the doped region, and another part of the source is located in the substrate with the first conductivity type.

18. The method of claim 16, wherein the transistor comprises a drain in the substrate, and further comprises forming a bit line (BL) electrically connected to the drain.

* * * * *